United States Patent
Joo

(10) Patent No.: US 8,071,423 B2
(45) Date of Patent: Dec. 6, 2011

(54) VARIABLE RESISTANCE MEMORY DEVICES AND METHODS OF FORMING VARIABLE RESISTANCE MEMORY DEVICES

(75) Inventor: Heung Jin Joo, Suwon-si (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 12 days.

(21) Appl. No.: 12/652,451

(22) Filed: Jan. 5, 2010

(65) Prior Publication Data

US 2010/0173479 A1    Jul. 8, 2010

(30) Foreign Application Priority Data

Jan. 6, 2009  (KR) .................. 10-2009-0000854

(51) Int. Cl.
    *H01L 47/00*    (2006.01)
(52) U.S. Cl. .................. 438/102; 438/253; 257/E47.005

(58) Field of Classification Search .................. 438/102, 438/253
    See application file for complete search history.

(56) References Cited

U.S. PATENT DOCUMENTS

| 7,473,597 B2 | 1/2009 | Lee et al. | |
| 2005/0130367 A1* | 6/2005 | Lee et al. | 438/238 |

FOREIGN PATENT DOCUMENTS

| JP | 2007-129200 | 5/2007 |
| KR | 100791694 B1 | 12/2007 |

* cited by examiner

*Primary Examiner* — Alexander Ghyka
(74) *Attorney, Agent, or Firm* — Myers Bigel Sibley & Sajovec, P.A.

(57) ABSTRACT

Provided are variable resistance memory devices and methods of forming the variable resistance memory devices. The methods can include forming an etch stop layer on an electrode, forming a molding layer on the etch stop layer, forming a recess region including a lower part having a first width and an upper part having a second width by recessing the etch stop layer and the molding layer, and forming a layer of variable resistance material in the recess region.

9 Claims, 10 Drawing Sheets

VARIABLE RESISTANCE MEMORY DEVICES AND METHODS OF FORMING VARIABLE RESISTANCE MEMORY DEVICES

CROSS-REFERENCE TO RELATED APPLICATIONS

This U.S. nonprovisional patent application claims the benefit of priority under 35 U.S.C. §119 of Korean Patent Application 10-2009-0000854, filed on Jan. 6, 2009, the entire disclosure of which is hereby incorporated by reference.

BACKGROUND

Various embodiments relate to semiconductor devices and, more particularly, to semiconductor memory devices and methods of forming semiconductor memory devices.

Generally, semiconductor memory devices may be classified into volatile memory devices and nonvolatile memory devices. Volatile memory devices lose stored data when the power supply is interrupted. Examples of the volatile memory devices may include Dynamic Random Access Memories (DRAMs) and Static Random Access Memories (SRAMs). Meanwhile, the nonvolatile memory devices do not lose the stored data even when the power supply is interrupted. Examples of the nonvolatile memory devices may include Programmable ROMs (PROMs), Erasable PROMs (EPROMs), Electrically EPROMs (EEPROMs), and flash memory devices.

Developments have been actively made on next-generation semiconductor memory devices such as Ferroelectric Random Access Memories (FRAMs), Magnetic Random Access Memories (MRAMs), and Phase-change Random Access Memories (PRAMs) in accordance with the tendency toward improved performance and reduced power semiconductor memory devices. These next-generation semiconductor memory devices are made of materials that vary in programmed resistance state according to programming current and/or voltage and keep the programmed resistance state even though the power is interrupted.

A phase change memory device (PRAM) is a variable resistance memory device that utilizes a phase change material, and a phase change memory device (PRAM) may provide relatively high operation speed and high integration.

Phase change memory devices store information by using phase change materials. A phase change material has two stable states (that is, a crystalline state and an amorphous state) in which resistivity differs. Since the conversion may be reversibly generated between two stable states, the phase change material may be converted into the crystalline state from the amorphous state and may then be converted back into the amorphous state from the crystalline state. The phase change material may be converted into the amorphous state from the crystalline state and may then be converted back into the crystalline state from the amorphous state. The resistivity of the phase change material in the amorphous state is higher than that of the phase change material in the crystalline state. A phase change memory device can store data in phase change memory cells using the difference in resistivity according to the state of the phase change material and can read the data stored in the phase change memory cells.

SUMMARY

Various embodiments are directed to structures and methods that may provide a uniform variable resistance memory layer.

Various embodiments are directed to structures and methods that may reduce a contact surface between a variable resistance memory layer and a first electrode.

Some embodiments of the present invention may provide variable resistance memory devices including an etch stop layer on a first electrode and a molding layer on the etch stop layer. The molding layer and the etch stop layer may comprise layers different materials, and may expose a portion of the first electrode. A first width of a hole through the etch stop layer may be less than a second width of a hole through the molding layer, thus leaving surface portions of the etch stop layer free of the molding layer opposite the first electrode. A layer of variable resistance material may fill a portion of the hole through the etch stop layer. A second electrode may be provided on the layer of variable resistance material, thereby electrically coupling the layer of variable resistance material between the first and second electrodes.

Some embodiments of the present invention may provide variable resistance memory devices including a controller coupled to the first and second electrodes. The controller may apply a first electrical signal to the layer of variable resistance material to provide a programmable region in a crystalline state to program a first logic level. The controller may apply a second electrical signal different from the first electrical signal to the layer of variable resistance material to provide the programmable region in an amorphous state to program a second logic level different from the first logic level.

Further embodiments of the present invention may provide methods of forming variable resistance memory devices. The methods may include forming an etch stop layer on an electrode, forming a molding layer on the etch stop layer, forming a recess region, and forming a layer of variable resistance material in the recess region. The recess region may include a first part through the etch stop layer having a first width and a second part through the molding layer having a second width by recessing the etch stop layer and the molding layer wherein the first and second widths are different.

In some embodiments of the methods, the first width may be narrower than the second width. The layer of variable resistance material may be a phase change material layer. Forming the recess region may include recessing a portion of the electrode.

Forming the recess region may include forming a first recess region having the first width by recessing the molding layer and the etch stop layer, and forming a second recess region having the second width by recessing the molding layer. Forming the second recess region may further include selectively etching the molding layer but not the etch stop layer. In such cases, the etch stop layer may be a silicon nitride layer, and the molding layer may be a silicon oxide layer.

Forming the recess region may further include forming a first recess region having the first width by recessing the molding layer, masking portions of the etch stop layer by forming spacers on sidewalls of the first recess region, forming a second recess region having the second width by recessing portions of the etch stop layer exposed between the spacers, and removing the spacers.

Removing the spacers may include forming a third recess region having a third width by recessing the molding layer, and the third width may be wider than the first width. The spacers may be silicon oxide spacers or silicon oxynitride spacers.

In some embodiments, methods of forming a variable resistance memory device may include forming a first electrode through a first insulating layer, forming an etch stop layer on the first electrode and on the first insulating layer, forming a molding layer on the etch stop layer, forming a hole through the molding layer and the etch stop layer, forming a layer of variable resistance material in the hole, and forming a second electrode on the layer of variable resistance material. The molding layer and the etch stop layer may comprise layers of different materials. Forming the hole may expose a portion of the first electrode, and a first width of the hole through the etch stop layer may be less than a second width of the hole through the molding layer so that surface portions of the etch stop layer are exposed opposite the first electrode. Forming the second electrode on the layer of variable resistance material may electrically couple the first and second electrodes.

In some embodiments, the etch stop layer includes a first etch stop layer. Before forming the hole, a second etch stop layer may be formed on the molding layer, and a second insulating layer may be formed on the second etch stop layer. Forming the hole may further include forming a hole through the molding layer, the second insulating layer, and the etch stop layers to expose a portion of the electrode, selectively increasing a width of the molding layer relative to the first etch stop layer, and removing the second insulating layer and the etch stop layers. Forming the hole may include recessing a portion of the first electrode.

In some embodiments, the layer of the variable resistance material may be a layer of at least one of GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), or $Te_{81}Ge_{15}Sb_2S_2$.

Forming the hole may include forming a first recess region having the first width by recessing the molding layer, the first etch stop layer, and the second etch stop layer, and fanning a second recess region having the second width by recessing the molding layer.

Forming the hole may further include forming spacers on the molding layer. A first recess region having the first width may be formed by recessing the molding layer, the first etch stop layer, and the second etch stop layer. A second recess region having the second width may be formed by recessing the molding layer, and removing the spacers.

Forming the hole may include forming spacers on the molding layer, forming a first recess region having the first width by selectively recessing the molding layer, and forming a second recess region having the second width by recessing the etch stop layer using the spacers as masks. The first width may be wider than the second width.

Forming the spacers on the molding layer may include forming a second etch stop layer on the molding layer and forming a second insulating layer on the second etch stop layer, recessing the second insulating layer to expose a portion of the second etch stop layer, and forming a third insulating layer on a portion of the exposed second etch stop layer.

BRIEF DESCRIPTION OF THE DRAWINGS

The accompanying drawings are included to provide a further understanding of the embodiments. The drawings illustrate some embodiments of the present invention and, together with the description, serve to explain principles of the present invention. In the drawings.

DETAILED DESCRIPTION OF EMBODIMENTS

Figure 1:
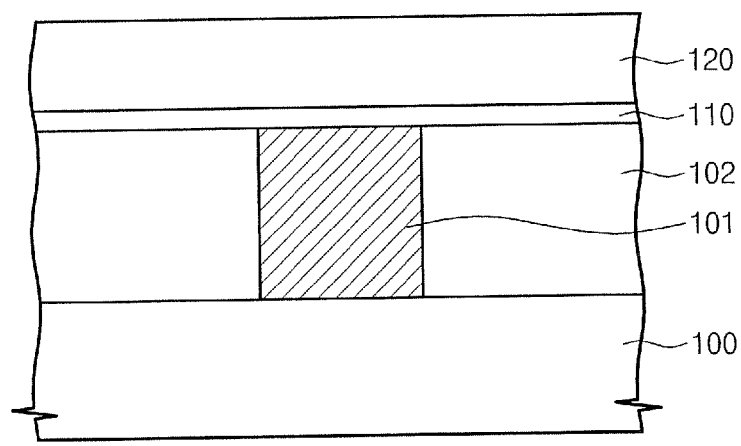
FIGS. 1 to 7 are cross-sectional views illustrating a variable resistance memory device and methods of forming the variable resistance memory device according to some embodiments of the present invention.

Advantages and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when any layers such as a conductive layer, a semiconductor layer, and an insulating layer are referred to as being "on" another material layer or substrate, it may be directly on the other material layer or substrate or intervening elements or layers may be present. In contrast, when an element is referred to as being "directly on," "directly connected to," or "directly coupled to" another element or layer, there are no intervening elements or layers present. It will be understood that, although the terms first, second, etc. are used herein to describe various elements, these elements should not be limited by these terms. These terms are used to distinguish one element from another. Thus, a first element, component, region, layer or section discussed below could be termed a second element, component, region, layer or section without departing from the teachings of the present invention.

Spatially relative tent's, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations and/or plane illustrations that are schematic illustrations of idealized embodiments of example embodiments. In drawings, the thickness of layers and regions is exaggerated to effectively describe technical details. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, variable resistance memory devices and methods of forming the variable resistance memory devices will be described according to various embodiments of the present invention in conjunction with the accompanying drawings.

FIGS. 1-7 are cross-sectional views illustrating variable resistance memory device structures and methods of forming variable resistance memory devices according to some embodiments of the present invention.

Referring to FIG. 1, a first insulating layer 102 may be provided on a substrate 100. The substrate 100 may refer to a semiconductor-based structure having a silicon surface. This semiconductor-based structure may, for example, include silicon, silicon-on-insulator (SOI), and/or silicon epitaxial layer supported by a semiconductor structure. The first insulating layer 102 may include an oxide layer, a nitride layer, and/or an oxynitride layer.

A first electrode 101 may be provided in the first insulating layer 102. The first electrode 101 may serve as a heater by coming in contact with a phase change material layer that will be described later. The phase change material may be a binary compound such as GaSb, InSb, InSe, $Sb_2Te_3$, or GeTe; a ternary compound such as GeSbTe, GaSeTe, InSbTe, $SnSb_2Te_4$, or InSbGe; or a quaternary compound such as AgInSbTe, (GeSn)SbTe, GeSb(SeTe), or $Te_{81}Ge_{15}Sb_2S_2$. The first electrode 101 may be formed using transition metals, conductive transition metal nitrides, and/or conductive ternary nitrides. The transition metal may include, for example, titanium (Ti), zirconium (Zr), hafnium (Hf), vanadium (V), niobium (Nb), tantalum (Ta), and/or tungsten (W). The first electrode 101 may be a cylinder type electrode, a U-type electrode, a line type electrode, a dash type electrode, or a half-ring type electrode.

An etch stop layer 110 may be provided on the first electrode 101 and the first insulating layer 102. The etch stop layer 110 may reduce excessive etching during a following process. The etch stop layer 110 may be formed by a Chemical Vapor Deposition (CVD). The etch stop layer 110 may be a silicon nitride layer. A molding layer 120 is provided on the etch stop layer 110. The molding layer may be a silicon oxide layer. The molding layer may be formed by a High-Density Plasma CVD (HDCVD) or a Plasma-Enhanced CVD (PECVD).

Figure 2:
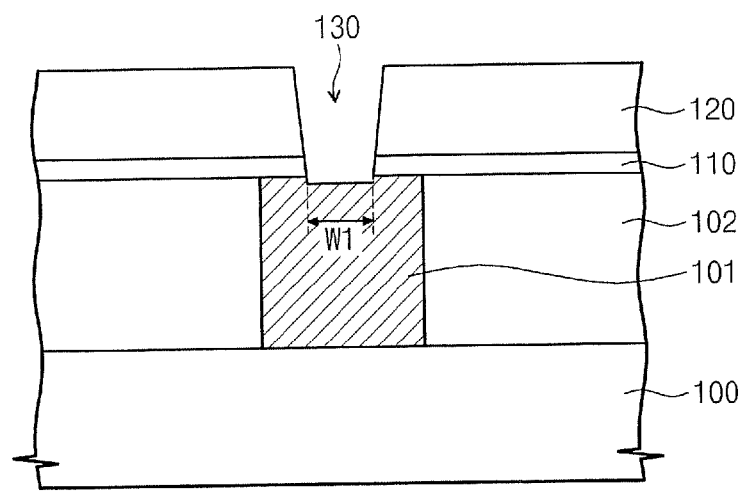

Referring to FIG. 2, a first recess region 130 may be formed by recessing the molding layer 120 and the etch stop layer 110. The first recess region 130 may expose the first electrode 101. The first recess region 130 may have first width W1. A transverse section of the first recess region (i.e., in a plane perpendicular to the cross-section of FIG. 2 and parallel with a surface of substrate 100) may be a circle, an oval, a square, or a rectangle. The first width W1 may establish a basis of a contact surface between the first electrode 101 and a phase change material layer that will be described later. The recess process may recess a portion of the first electrode 101. The recess process may include an anisotropic etching. The anisotropic etching may be a plasma etching using $C_5F_8$, $O_2$, and Ar gases.

Figure 3:
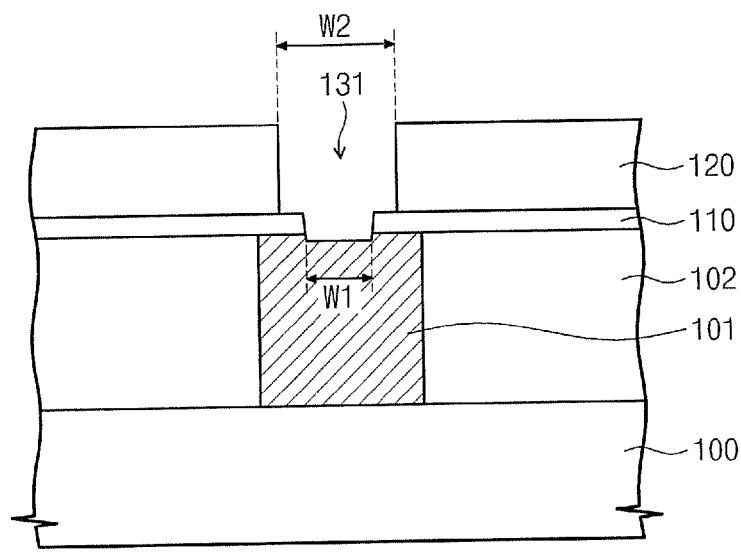

Referring to FIG. 3, a second recess region 131 may be formed by selectively recessing more of the molding layer 120, as compared with the first recess region 130. An upper part of the second recess region 131 may have second width W2. A lower part of the second recess region 131 may have first width W1. The selective recess process may be performed using an etching process having an etch selectivity with respect to the molding layer 120. The etching process may be a wet etching process including hydrogen fluoride (HF). The etch selectivity represents how fast one layer is etched under the same etching condition as compared to the other layer. A second recess region 131 having plural widths W1 and W2 may be formed by the selective recess process.

Figure 4:
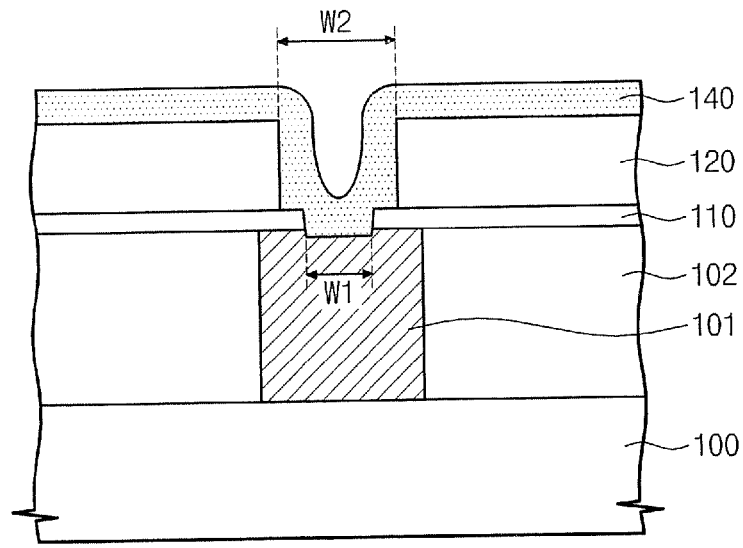

Referring to FIG. 4, a variable resistance layer may be conformally provided on the second recess region 131, the first electrode 101, and the molding layer 120. The variable resistance layer may be a phase change material layer 140. If the contact surface between the phase change material layer 140 and the first electrode 101 is decreased, a reset current $I_{reset}$ may be reduced. However, as the contact surface is reduced, an aspect ratio may increase. The aspect ratio is defined as a ratio of the depth to the width of the recess region. When the aspect ratio increases, it may be difficult for the phase change material layer 140 to be uniformly deposited on the recess region. In this case, a void may be formed, thereby causing a defect. To reduce void formation, the phase change material layer 140 may be more thinly deposited. In this case, however, set resistance $R_{set}$ may increase, and thus the sensing margin may be reduced. According to some embodiments of the present invention, the second recess region 131 may be configured to have a lower part having the first width W1 and an upper part having the second width W2, thereby reducing the contact surface between the phase change material layer 140 and the first electrode 101 while more uniformly depositing the phase change material layer 140. When the phase change material layer 140 is thick, a void may be formed at a center of the phase change material layer 140. According to some embodiments of the present invention, the phase change material layer 140 may be more thinly formed to have a U-shaped vertical cross-section as shown in FIG. 4.

Figure 5:
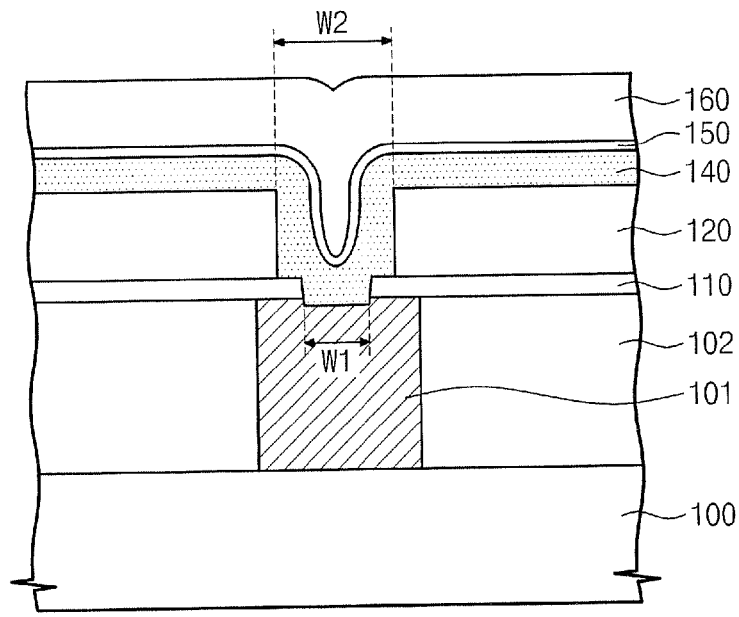

Referring to FIG. 5, an oxidation barrier layer 150 and a second insulating layer 160 may be formed on the phase change material layer 140. The oxidation barrier layer 150 may reduce oxidation of the phase change material layer 140 during the formation of the second insulating layer 160. The oxidation barrier layer 150 may be a silicon nitride layer. The second insulating layer 160 may fill an inner space of the U-shaped phase change material layer 140. The second insulating layer 160 may be a silicon oxide layer.

Figure 6:
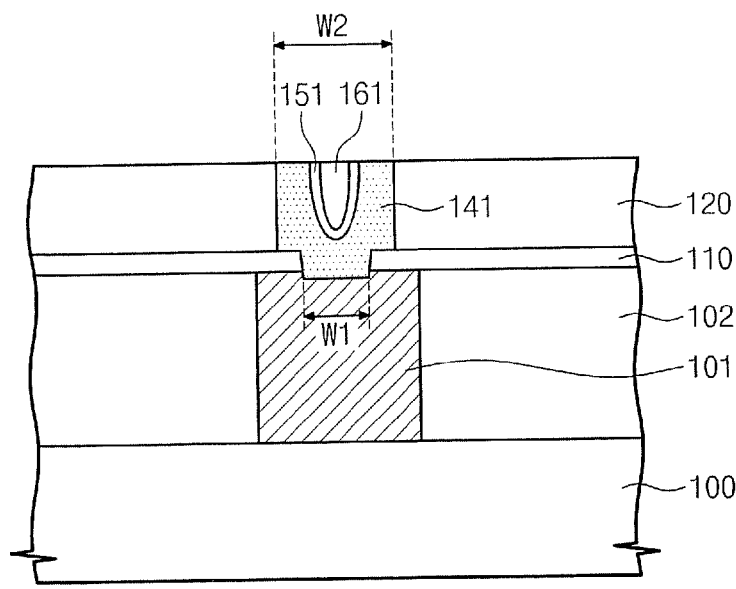

Referring to FIG. 6, the phase change material layer 140, the oxidation barrier layer 150, and the second insulating layer 160 may be planarized by a Chemical Mechanical Planarization (CMP) or an etch back. By the planarization, a phase change material pattern 141, an oxidation barrier pattern 151, and an insulating pattern 161 are formed. Moreover, phase change patterns of different memory cells may be separated by the planarization.

Figure 7:
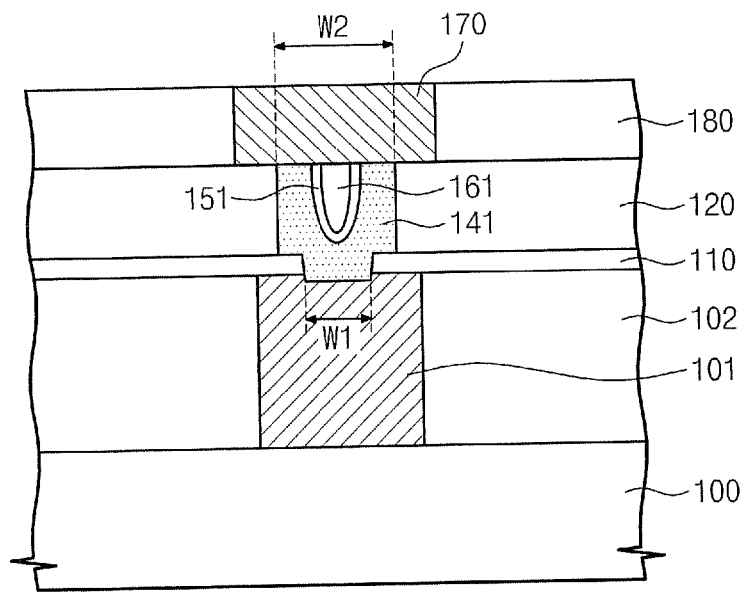

Referring to FIG. 7, a second electrode 170 is formed on the phase change material pattern 141. The second electrode 170 may be formed by depositing a second electrode material (not shown) and then patterning. The second electrode material may be deposited by sputtering. The second electrode 170 may include a transition metal, a conductive transition metal nitride, and/or a conductive ternary nitride. After the formation of the second electrode 170, a third insulating layer 180 may be formed. The third insulating layer 180 may be a layer of the same material as the first insulating layer.

According to some embodiments of the present invention, the variable resistance memory device may include the etch stop layer 110 on the first electrode 101, the molding layer 120 on the etch stop layer 110, the phase change material pattern 141 coming in contact with the first electrode 101 by penetrating the molding layer 120 and the etch stop layer 110, and the second electrode 170 on the phase change material pattern 141. The width W2 of the phase change material pattern 141 penetrating the molding layer 120 may be wider than the width W1 of the phase change material pattern 141 penetrating the etch stop layer 110. In the variable resistance memory device formed according to some embodiments of the present invention, since an upper part of the phase change material pattern 141 may be formed so as to be wider than a lower part thereof, the deposition can be performed more uniformly. In addition, forming the phase change material pattern 141 as shown in FIGS. 1-7 can reduce the reset current $I_{reset}$ by decreasing the contact surface between the phase change material pattern 141 and the first electrode 101.

Embodiments discussed below are similar to embodiments discussed with respect to FIGS. 1-7 except for the methods of forming recess regions. Accordingly, with respect to the duplicated technical features, description will be omitted hereinafter for brevity.

Figure 8:
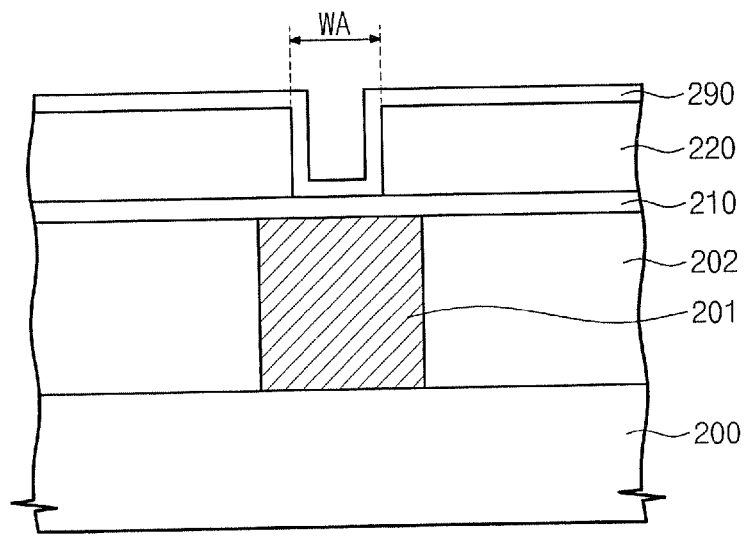
FIGS. 8 to 11 are cross-sectional views illustrating a variable resistance memory device and methods of forming the variable resistance memory device according to some embodiments of the present invention.

Referring to FIG. 8, a first insulating layer 202 may be provided on a substrate 200, and a first electrode 201 is provided in the first insulating layer 202. An etch stop layer 210 may be provided on the first electrode 201, and a molding layer 220 may be provided on the etch stop layer 210. A first recess region having a first width WA may be formed by recessing the molding layer 220 to expose the etch stop layer 210. A second insulating layer 290 may be foamed on the recessed molding layer 220. The second insulating layer 290 may be formed of materials having an etching rate higher than that of the molding layer 220. The second insulating layer 290 may be a silicon oxide layer and/or a silicon oxynitride layer. The second insulating layer 290 may be formed by a low temperature sputtering in the range of 150° C. to 300° C. and/or an atomic layer deposition (ALD).

Figure 9:
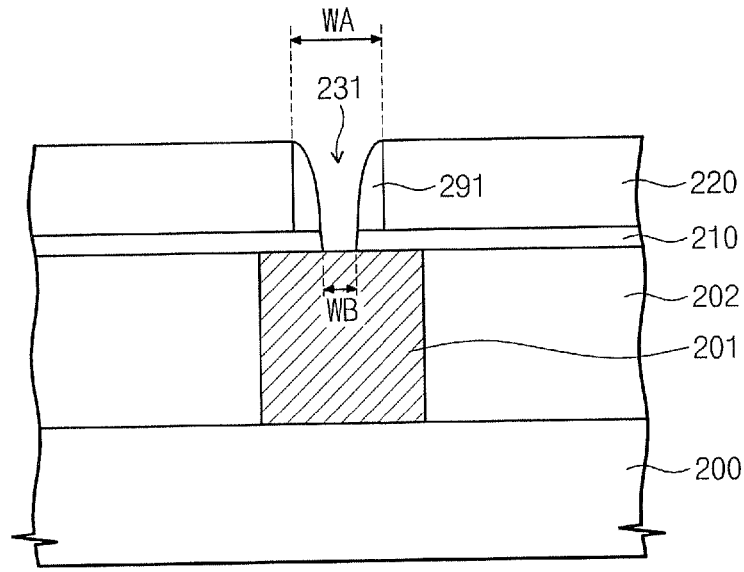

Referring to FIG. 9, spacers 291 may be formed on sidewalls of the first recess region by anisotropically etching the second insulating layer 290. The spacers 291 may expose the etch stop layer 210. A second recess region 231 may be formed by recessing the exposed etch stop layer 210 while using the spacers 291 as an etching mask. The lower part of the second recess region 231 may have a second width WB smaller than the first width WA. The spacers 291 may further reduce the contact surface between the first electrode 201 and the phase change material layer. As the contact surface decreases, it can reduce the reset current $I_{reset}$.

Figure 10:
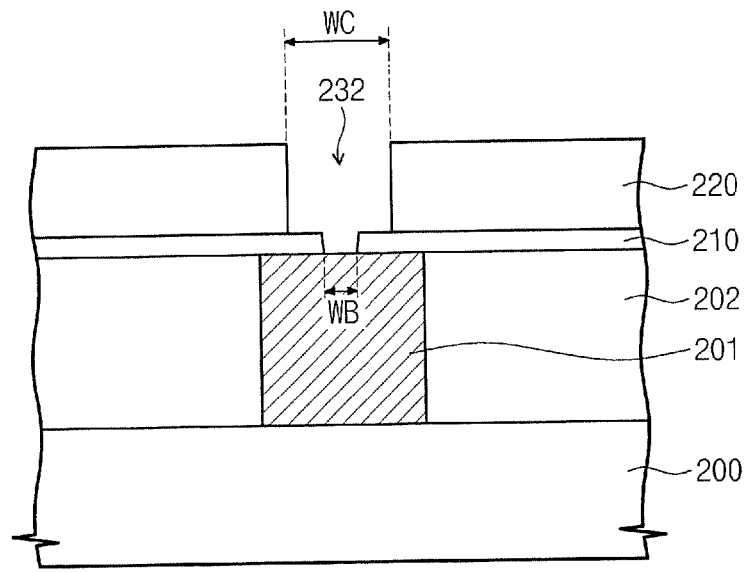

Referring to FIG. 10, the spacers 291 may be removed. The spacers 291 may be removed by a wet etching process including, for example hydrogen fluoride (HF), to provide an etch selectivity with respect to the spacers 291. During the wet etching process, the etch stop layer 210 is not etched, and the second recess region 231 having the second width WB may be maintained. By further recessing the molding layer 220, a third recess region 232 having a third width WC larger than the first width WA may be formed.

Figure 11:
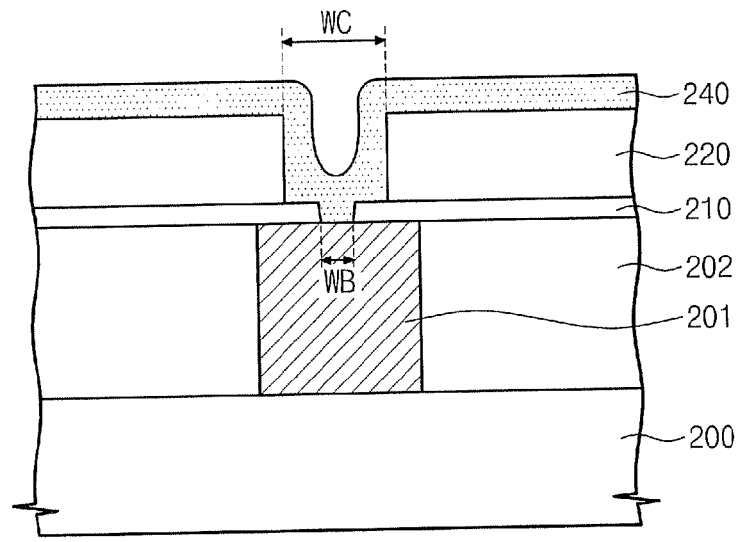

Referring to FIG. 11, a phase change material layer 240 may conformally be provided on the third recess region 232, the first electrode 201, and the molding layer 220. If the contact surface between the phase change material layer 240 and the first electrode 201 is decreased, the reset current $I_{reset}$ can be reduced. However, as the contact surface becomes small, an aspect ratio may increase. The aspect ratio is defined as a ratio of the depth to the width of the recess region. When the aspect ratio increases, it may be difficult for the phase change material layer 140 to be deposited uniformly on the recess region. In this case, a void may be formed, thereby causing a defect. To reduce void formation, the phase change material layer 240 may be more thinly deposited. In this case, however, set resistance $R_{set}$ may increase, and thus the sensing margin may be reduced. According to some embodiments of the present invention, the third recess region 232 may be configured by a lower part having the second width WB and an upper part having the third width WC, thereby reducing the contact surface between the phase change material layer 240 and the first electrode 201 while more uniformly depositing the phase change material layer 240. When the phase change material layer 240 is thick, a void may be formed at a center of the phase change material layer 240. According to some embodiments of the present invention, the phase change material layer 240 may be thinly formed to have a U-shaped vertical cross-section.

The following processes may be performed in a similar manner as described with reference to FIGS. 5 to 7. Accordingly, with respect to duplicated technical features, the description will be omitted hereinafter for brevity.

Figure 12:
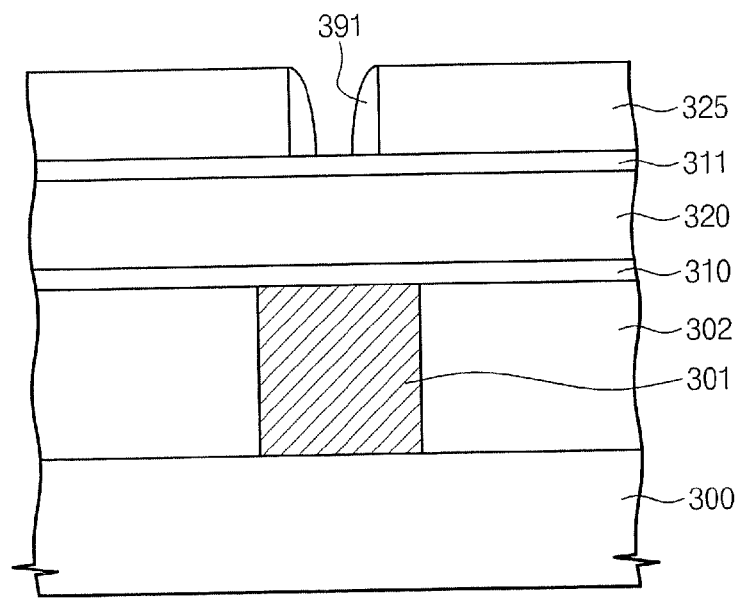
FIGS. 12 to 15 are cross-sectional views illustrating a variable resistance memory device and methods of forming the variable resistance memory device according to some embodiments of the present invention.

Referring to FIG. 12, a first insulating layer 302 may be provided on a substrate 300, and a first electrode 301 may be provided in the first insulating layer 302. A first etch stop layer 310 is provided on the first electrode 301, and a molding layer 320 is provided on the first etch stop layer 310. Spacers 391 may be formed on the molding layer 320. A second etch stop layer 311 may be formed on the molding layer 320, and then a second insulating layer 325 may be formed on the second etch stop layer 311. After a recess region is formed by patterning the second insulating layer 325, a third insulating layer (not shown) may be formed on the recess region. The spacers 391 may be formed by anisotropically etching the third insulating layer.

Figure 13:
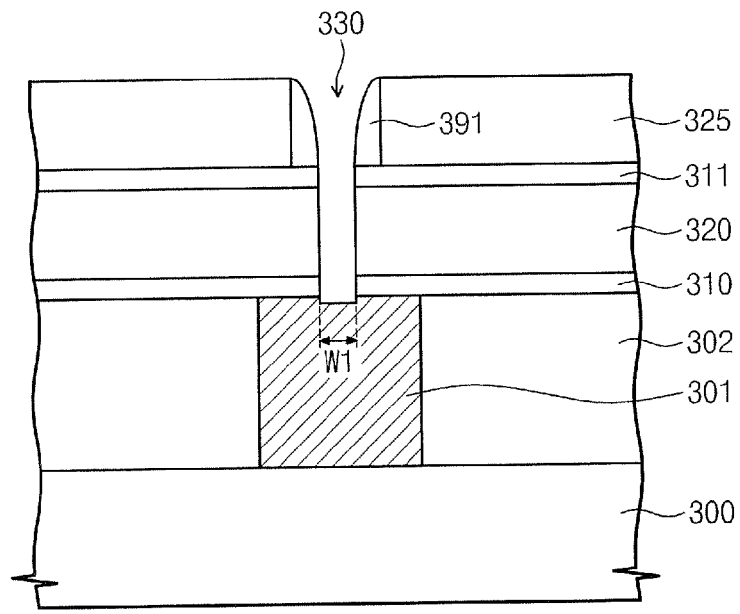

Referring to FIG. 13, a first recess region 330 may be formed by recessing the second etch stop layer 311, the molding layer 320, and the first etch stop layer 310 while using the spacers 391 as an etching mask. The first recess region 330 may expose the first electrode 301. The first recess region 330 may have a first width W1. The recess process may recess a portion of the first electrode 301. The recess process may include an anisotropic etching. The anisotropic etching may be a plasma etching using $C_5F_8$, $O_2$, and Ar gases.

Figure 14:
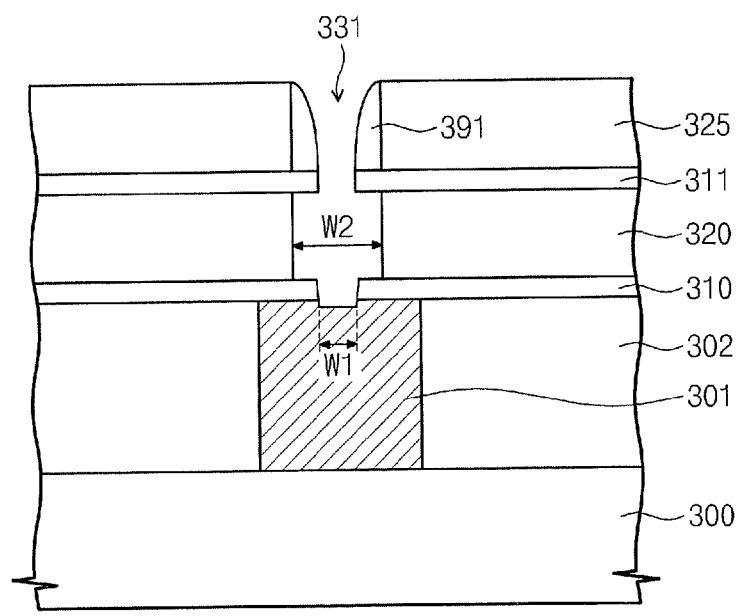

Referring to FIG. 14, a second recess region 331 may be formed by selectively recessing more of the molding layer 320, as compared with spacers 391 and etch stop layers 310 and 311. A center of the second recess region 331 may have a second width W2. A lower part of the second recess region 331 may have a first width W1. The selective recess process may be performed by an etching process having an etch selectivity with respect to the molding layer 320. The etching process may be a wet etching process including hydrogen fluoride (HF). The etch selectivity represents how fast one layer is etched under the same etching condition as compared to the other layer. The second recess region 331 having plural widths may be formed by the selective recess process.

Figure 15:
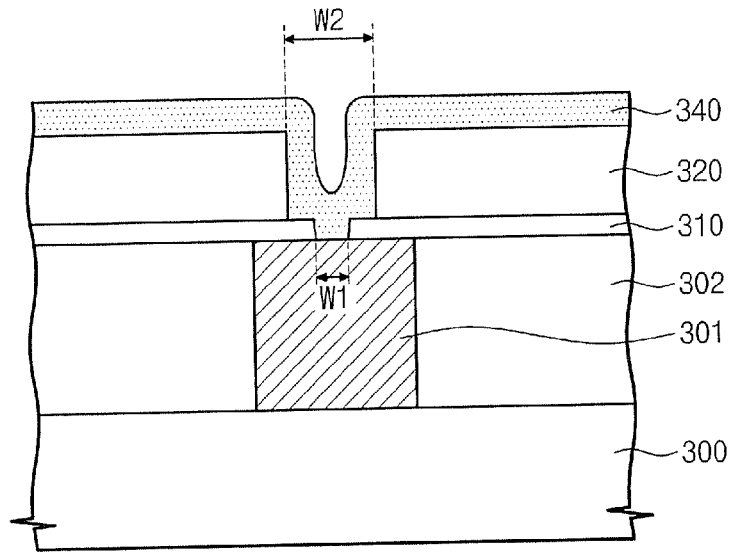

Referring to FIG. 15, an upper part of the second recess region 331 may be removed by a CMP. A phase change material layer 340 may conformally be provided on the second recess region 331 of which the upper part is removed, the first electrode 301, and the molding layer 320. If the contact surface between the phase change material layer 340 and the first electrode 301 is decreased, the reset current $I_{reset}$ may be reduced. However, as the contact surface becomes small, an aspect ratio increases. The aspect ratio is defined as a ratio of the depth to the width of the recess region. When the aspect ratio increases, it may be difficult for the phase change material layer 340 to be deposited uniformly on the recess region. Moreover, a void may be formed, thereby causing a defect. To reduce void formation, the phase change material layer 340 may be more thinly deposited. In this case, however, set resistance $R_{set}$ may increase, and thus the sensing margin may be reduced. According to some embodiments of the present invention, the second recess region 331 includes a lower part having the first width W1 and an upper part having the second width W2, thereby reducing the contact surface between the phase change material layer 340 and the first electrode 301 while more uniformly depositing the phase change material layer 340. When the phase change material layer 340 is thick, the void may be formed at a center of the phase change material layer 340. According to some embodiments of the present invention, the phase change material layer 340 may be thinly formed to have a U-shaped vertical section.

The following processes may be performed in similar manners as described with reference to FIGS. 5 to 7. Accordingly, with respect to the duplicated technical features, the description will be omitted hereinafter for brevity.

Figure 16:
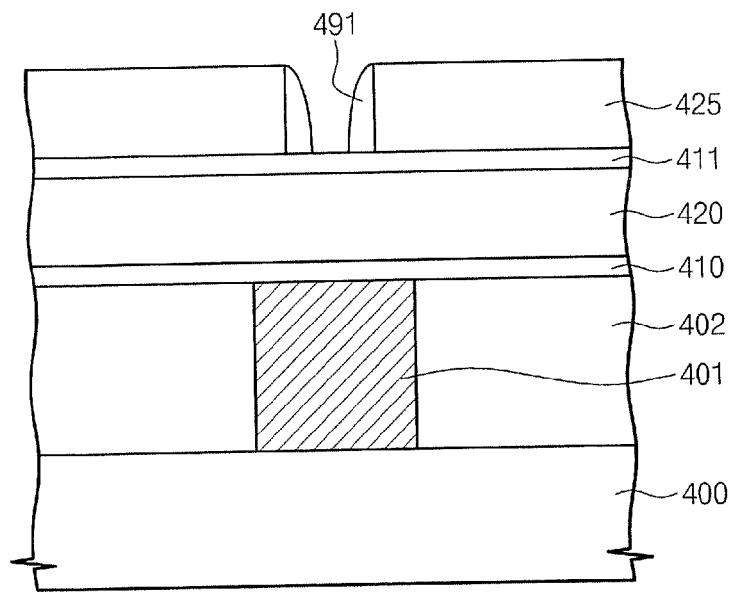
FIGS. 16 to 19 are cross-sectional views illustrating a variable resistance memory device and methods of forming the variable resistance memory device according to some embodiments of the present invention.

Referring to FIG. 16, a first insulating layer 402 may be provided on a substrate 400, and a first electrode 401 may be provided in the first insulating layer 402. A first etch stop layer 410 may be provided on the first electrode 401, and a molding layer 420 may be provided on the first etch stop layer 410. Spacers 491 may be formed on the molding layer 420. A second etch stop layer 411 may be formed on the molding layer 420, and then a second insulating layer 425 may be formed on the second etch stop layer 411. After a recess region is formed by patterning the second insulating layer 425, a third insulating layer (not shown) may be formed on the recess region. The spacers 491 may be formed by anisotropically etching the third insulating layer.

Figure 17:
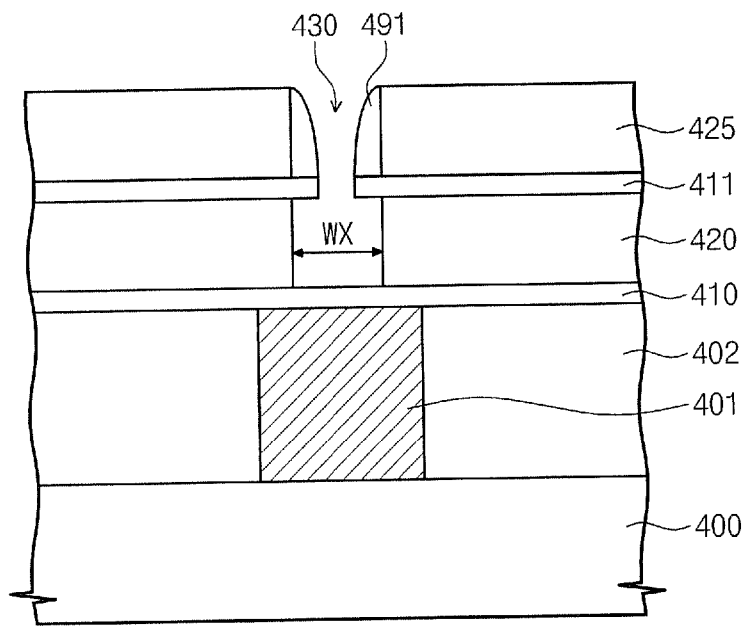

Referring to FIG. 17, a first recess region 430 may be formed by selectively recessing the molding layer 420 and the second etch stop layer 411 exposed by the spacers 491. A lower part of the first recess region 430 may have a first width WX. The selective recess process may be performed by an etching process having an etch selectivity with respect to the molding layer 420. The etching process may be a wet etching process including hydrogen fluoride (HF). The etch selectivity represents how fast one layer is etched under the same etching condition as compared to the other layer.

Figure 18:
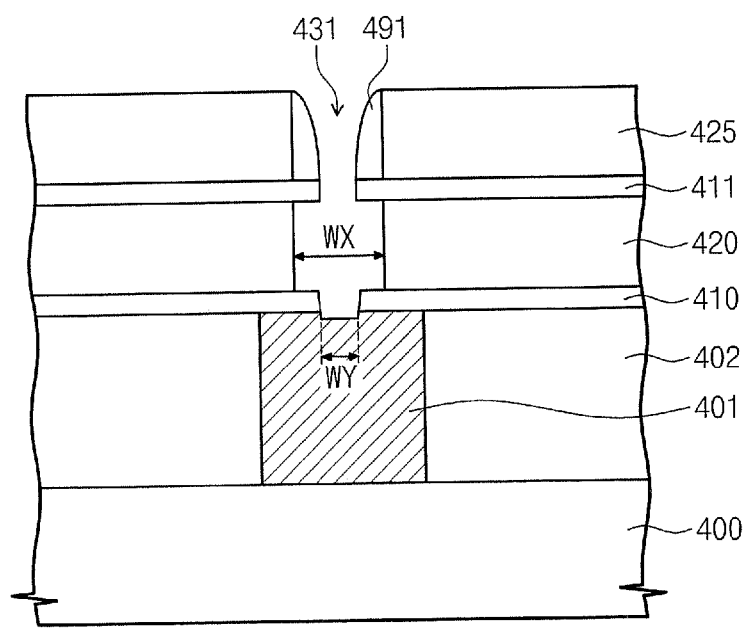

Referring to FIG. 18, a second recess region 431 may be formed by recessing the first etch stop layer 410 while using the spacers 491 as an etching mask. The second recess region 431 may expose the first electrode 401. The second recess region 431 may be configured by a lower part having a second width WY and a middle part having the first width WX. The recess process may recess a portion of the first electrode 401. The recess process may include an anisotropic etching. The anisotropic etching may be a plasma etching using $C_5F_8$, $O_2$, and Ar gases.

Figure 19:
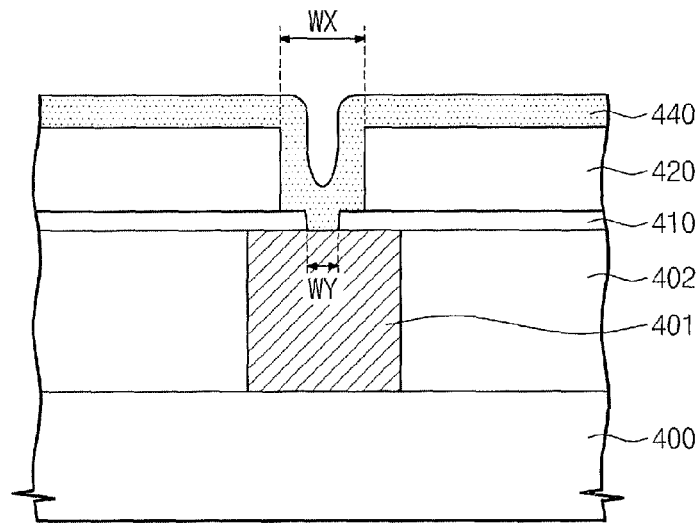

Referring to FIG. 19, an upper part of the second recess region 431 may be removed by a CMP. A phase change material layer 440 may be conformally provided on the second recess region 431 of which the upper part is removed, the first electrode 401, and the molding layer 420. If the contact surface between the phase change material layer 440 and the first electrode 401 is decreased, the reset current $I_{reset}$ may be reduced. However, as the contact surface becomes small, an aspect ratio may increase. The aspect ratio is defined as a ratio of the depth to the width of the recess region. When the aspect ratio increases, it may be difficult for the phase change material layer 440 to be uniformly deposited on the recess region. Moreover, a void may be formed, thereby causing a defect. To reduce void formation, the phase change material layer 440 may be more thinly deposited. In this case, however, set resistance $R_{set}$ may increase, and thus the sensing margin may be reduced. According to some embodiments of the present invention, the second recess region 431 includes an upper part having the first width WX and a lower part having the second width WY, thereby reducing the contact surface between the phase change material layer 440 and the first electrode 401 while more uniformly depositing the phase change material layer 440. When the phase change material layer 440 is thick, the void may be formed at a center of the phase change material layer 440. According to some embodiments of the present invention, the phase change material layer 440 may be thinly formed to have a U-shaped vertical cross-section.

Figure 20:
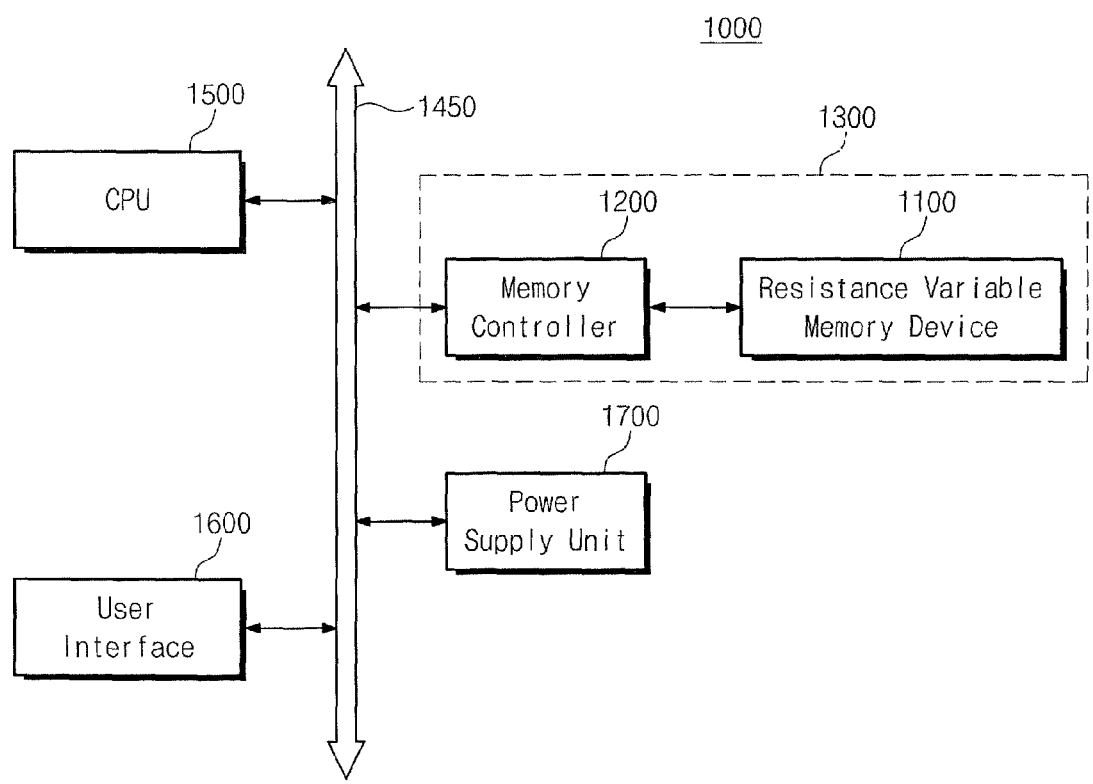
FIG. 20 is a block diagram of a memory system including a variable resistance memory device according to some embodiments of the present invention.

FIG. 20 is a block diagram illustrating examples of the applications of variable resistance memory devices according to various embodiments of the present invention.

Referring to FIG. 20, a memory system 1000 may include a semiconductor memory device 1300 having a variable resistance memory device (for example, PRAM) 1100 and a memory controller 1200, a central processing unit (CPU) 1500 that is electrically connected to a system bus 1450, a user interface 1600, and power supply unit 1700.

Data may be provided through the user interface 1600 and/or processed by the CPU 1500. The data may be stored in the variable resistance memory device 1100 through the memory controller 1200. The semiconductor memory device 1300 may be a solid state drive (SSD). In these cases, the memory system 1000 may significantly improve writing speed.

Although not illustrated in FIG. 20, it will be apparent to those skilled in the art that an application chipset, a Camera Image Processor (CIS), a mobile DRAM, and so on may further be provided to the memory system 1000 according to various embodiments of the present invention.

In addition, the memory system 1000 may be applicable to a PDA, portable computer, web tablet, wireless phone, mobile phone, digital music player, memory card, or all of devices capable of transmitting and/or receiving information in a wireless environment.

Furthermore, the variable resistance memory device or the memory system according to the embodiments of the present invention may be mounted by various types of packages. For example, the variable resistance memory device or the memory system may be packaged and mounted in such manners as a Package on Package (PoP), a Ball Grid Array (BGA), a Chip Scale Package (CSP), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP), and the like.

Various embodiments can provide a memory device having a uniform phase change material layer by forming a recess region having plural diameters. Moreover, various embodiments can reduce a contact surface between a phase change material layer and a first electrode.

Although the present invention has been particularly shown and described with reference to embodiments thereof, it will be understood by those of ordinary skill in the art that various changes in form and details may be made therein without departing from the scope and spirit of the present invention as defined by the following claims.

What is claimed is:

1. A method of forming a variable resistance memory device, the method comprising:
    forming an etch stop layer on an electrode;
    forming a molding layer on the etch stop layer;
    forming a recess region including a first part through the etch stop layer having a first width and a second part through the molding layer having a second width by recessing the etch stop layer and the molding layer wherein the first and second widths are different; and
    forming a layer of variable resistance material in the recess region,
    wherein the forming of the recess region includes:
    forming a first recess region having the first width by recessing the molding layer and the etch stop layer; and
    forming a second recess region having the second width by recessing the molding layer.

2. The method of claim 1, wherein the first width is narrower than the second width.

3. The method of claim 1, wherein the layer of variable resistance material is a layer of phase change material.

4. The method of claim 1, wherein the forming of the recess region includes recessing a portion of the electrode.

5. The method of claim 1, wherein the forming of the second recess region selectively etches the molding layer while maintaining the etch stop layer.

6. The method of claim 5, wherein the etch stop layer is a silicon nitride layer, and the molding layer is a silicon oxide layer.

7. A method of forming a variable resistance memory device, the method comprising:
    forming an etch stop layer on an electrode;
    forming a molding layer on the etch stop layer;
    forming a recess region including a first part through the etch stop layer having a first width and a second part through the molding layer having a second width by recessing the etch stop layer and the molding layer wherein the first and second widths are different; and
    forming a layer of variable resistance material in the recess region, wherein the forming of the recess region includes:
    forming a first recess region having the first width by recessing the molding layer;
    masking portions of the etch stop layer by forming spacers on sidewalls of the first recess region;
    forming a second recess region having the second width by recessing portions of the etch stop layer exposed between the spacers; and
    removing the spacers.

8. The method of claim 7, wherein removing the spacers includes forming a third recess region having a third width by recessing the molding layer, the third width being wider than the first width.

9. The method of claim 7, wherein the spacers are silicon oxide spacers or silicon oxynitride spacers.

* * * * *